United States Patent [19]

Hikata et al.

[11] Patent Number: 5,246,917
[45] Date of Patent: Sep. 21, 1993

[54] METHOD OF PREPARING OXIDE SUPERCONDUCTING WIRE

[75] Inventors: Takeshi Hikata; Kenichi Sato, both of Osaka, Japan

[73] Assignee: Sumitomo Electric Industries, Ltd., Osaka, Japan

[21] Appl. No.: 854,128

[22] Filed: Mar. 19, 1992

[30] Foreign Application Priority Data

Mar. 20, 1991 [JP] Japan ................................ 3-56696

[51] Int. Cl.$^5$ ........................................... H01L 39/24
[52] U.S. Cl. ...................................... 505/1; 505/740; 505/742; 29/599; 148/96
[58] Field of Search ............. 148/96; 29/599; 505/1, 505/739, 740, 742

[56] References Cited

U.S. PATENT DOCUMENTS 5,045,527  9/1991  Ikeno et al. ..................... 505/740

FOREIGN PATENT DOCUMENTS 1-180306  7/1989  Japan ................................ 505/739
2-192619  7/1990  Japan ................................ 505/739

*Primary Examiner*—George Wyszomierski
*Attorney, Agent, or Firm*—Pennie & Edmonds

[57] ABSTRACT

In a method of preparing an oxide superconducting wire comprising the steps of filling up raw material powder for an oxide superconductor in a metal sheath, performing first rolling in this state for working the metal sheath into a tape, performing first heat treatment, then performing second rolling and further performing second heat treatment, diameters of rolls employed for the second rolling are larger by at least 5 cm than those of rolls employed for the first rolling, in order to improve the critical current density of the as-formed oxide superconducting wire over its longitudinal direction.

5 Claims, No Drawings

METHOD OF PREPARING OXIDE SUPERCONDUCTING WIRE

BACKGROUND OF THE INVENTION

1. Field of the Invention

The present invention relates to a method of preparing an oxide superconducting wire, and more particularly, it relates to improvement for increasing the critical current density as well as the length of an oxide superconducting wire.

2. Description of the Background Art

In recent years, superconductive materials of ceramics, i.e., oxide superconductive materials, are watched with interest due to higher critical temperatures thereof. For example, bismuth, yttrium and thallium oxide superconductive materials, which exhibit high critical temperatures of about 110° K., 90° K. and 120° K. respectively, are expected for practical application.

For example, it is known that a bismuth oxide superconductor contains phases having critical temperatures of 110° K., 80° K. and 10° K. respectively. It is also known that the 110° K. phase has a 2223 composition in a composition of Bi-Sr-Ca-Cu or (Bi, Pb)-Sr-Ca-Cu with Bi being partially replaced by Pb, while the 80° K. phase has a 2212 composition in the same composition.

In a method of preparing an oxide superconductor, an oxide superconductor or raw material powder therefor is filled up in a metal sheath and subjected to deformation processing and heat treatment, so that the oxide superconductor or the raw material powder contained in the metal sheath is sintered and brought into a superconducting state. This method is advantageously applied to preparation of a long superconducting wire, for example.

In order to apply an elongated oxide superconducting wire to a cable or a magnet, it is necessary to provide a high critical current density uniformly along its longitudinal direction. When an oxide superconducting wire such as a bismuth oxide superconducting wire is prepared, for example, raw material powder is filled up in a metal sheath, worked into a tape by first rolling and then heat treated, to obtain plate-type oxide superconductor particles of several 10 lm in length. Then, second rolling is so performed as to orient the plate-type particles in the same direction and bring grain boundaries therebetween into close contact with each other. When such second rolling is performed, therefore, loads are vertically and horizontally applied to the tape surface. Thus, cracking may be caused in the interior of the superconductor portion to reduce the current density.

SUMMARY OF THE INVENTION

Accordingly, an object of the present invention is to provide a method of preparing an oxide superconducting wire, which can attain a higher critical current density in the aforementioned second rolling after first heat treatment.

The present invention is directed to a method of preparing an oxide superconducting wire comprising the steps of filling up raw material powder for an oxide superconductor in a metal sheath, performing first rolling in this state for working the metal sheath into a tape, performing first heat treatment, then performing second rolling, and further performing second heat treatment, and in order to solve the aforementioned technical problem, diameters of rolls employed for the second rolling are made larger by at least 5 cm than those of rolls employed for the first rolling.

Throughout the specification, the term "raw material powder for an oxide superconductor" includes powder of an oxide superconductor already having superconductivity, powder of a raw material, not yet having superconductivity, for forming an oxide superconductor, and a mixture of such powder-materials.

According to the present invention, the metal sheath is advantageously made of silver or a silver alloy.

The diameters of the rolls employed for the second rolling are more preferably made larger by at least 20 cm than those of the rolls employed for the first rolling.

Particles of an oxide superconductor obtained by filling up raw material powder in a metal sheath, performing uniformly first rolling in this state and then performing heat treatment are in the form of plates of several 10 lm in length. When second rolling is thereafter performed, it is possible to reduce a load which is horizontally applied to the tape surface with respect to that vertically applied to the same by increasing the diameters of the rolls. Thus, it is possible to reduce longitudinal elongation of the wire, thereby suppressing cracking caused in a superconductor portion. The first rolling is carried out with the intention of applying uniform deformation to the metal sheath, while the second rolling is carried out with the intention of applying load while suppressing deformation.

According to the present invention, therefore, it is possible to densify an oxide superconductor portion in the interior of the as-formed wire while suppressing cracking. Thus, it is possible to obtain a long oxide superconducting wire having a high critical current density.

The foregoing and other objects, features, aspects and advantages of the present invention will become more apparent from the following detailed description of the present invention.

DESCRIPTION OF THE PREFERRED EMBODIMENT $Bi_2O_3$, $PbO$, $SrCO_3$, $CaCO_3$ and $CuO$ were mixed to prepare powder containing Bi, Pb, Sr, Ca and Cu in composition ratios of 1.8:0.4:2:2.2:3.

This powder was heat treated at 800° C. for 8 hours, and then pulverized in an automatic mortar for 2 hours. Thereafter the powder was heat treated at 860° C. for 8 hours, and again pulverized in a similar manner to the above.

The as-obtained fine powder was filled up in silver pipes of 30 mm in outer diameter and 20 mm in inner diameter, which in turn were drawn into 1 mm in outer diameter, and then rolled into 0.18 mm in thickness using rolls of 15 cm in diameter. Thereafter such samples were heat treated in the atmosphere at 845° C. for 50 hours, and then gradually cooled.

Thereafter the samples were subjected to second rolling. The diameters of rolls employed for the second rolling were made larger by the following values respectively as compared with those of rolls employed for the aforementioned first rolling:

(A) 3 cm
(B) 5 cm
(C) 10 cm
(D) 20 cm
(E) 40 cm

Thereafter the samples were heat treated at 840° C. for 50 hours, and critical current densities of the as-obtained oxide superconducting wires were measured at 77.3° K. over lengths of 1 m, 10 m and 100 m respectively. Table 1 shows the results.

TABLE 1

| Rolling Condition | A | B | C | D | E |
|---|---|---|---|---|---|
| Roll Diameter Difference (cm) | 3 | 5 | 10 | 20 | 40 |
| Wire Length (m) | Critical Current Density (A/cm$^2$) | | | | |
| 1 | 12000 | 22000 | 24000 | 31000 | 34200 |
| 10 | 9000 | 17000 | 19500 | 26000 | 28000 |
| 100 | 5000 | 13000 | 15000 | 24000 | 26000 |

It is understood from Table 1 that high critical current densities exceeding $10^4$ A/cm$^2$ were obtained in the samples (B) to (E), having roll diameter differences of at least 5 cm. Particularly in the samples (D) and (E) having roll diameter differences of at least 20 cm, the critical current densities exceeded $2 \times 10^4$ A/cm$^2$ over lengths of 100m, to provide higher critical current densities.

Although the present invention has been described in detail, it is clearly understood that the same is by way of example only and is not to be taken by way of limitation, the scope of the present invention being limited only by the terms of the appended claims.

We claim:

1. A method of preparing an oxide superconducting wire, said method comprising the steps of:
   filling up raw material powder for an oxide superconductor in a metal sheath;
   performing first rolling in this state for working said metal sheath into a tape;
   performing first heat treatment;
   performing second rolling using rolls with a diameter increased by at least 5 cm from those used in said first rolling;
   performing second heat treatment; and
   performing at least once after said second heat treatment step the steps of rolling said wire using said rolls with increased diameter and heat treating said wire.

2. A method of preparing an oxide superconducting wire in accordance with claim 1, wherein said oxide superconductor is a Bi-Sr-Ca-Cu or (Bi, Pb)-Sr-Ca-Cu oxide superconductor.

3. A method of preparing an oxide superconducting wire in accordance with claim 1, wherein said metal sheath is made of silver or a silver alloy.

4. A method of preparing an oxide superconducting wire in accordance with claim 1, wherein diameters of said rolls employed for said second rolling are larger by at least 20 cm than those of the rolls employed for said first rolling.

5. A method of preparing a Bi-containing oxide superconducting wire, having a critical current density of at least $10^4$ A/cm$^2$ when measured at 77.3° K., said method comprising the steps of:
   filling up raw material powder for an oxide superconductor in a metal sheath;
   performing first rolling in this state for working said metal sheath into a tape;
   performing first heat treatment;
   performing second rolling using rolls with a diameter increased by at least 5 cm from those used in said first rolling;
   performing second heat treatment; and
   performing at least once after said second heat treatment step the steps of rolling said wire using said rolls with increased diameter and heat treating said wire.

* * * * *